United States Patent [19]

Itoh

[11] Patent Number: 5,010,561

[45] Date of Patent: Apr. 23, 1991

[54] CIRCUIT FOR MULTIPLYING THE FREQUENCY IN ONE SERIES OF INPUT PULSES

[75] Inventor: Tatsuo Itoh, Higashikurume, Japan

[73] Assignee: Advanced Micro Devices, Inc., Sunnyvale, Calif.

[21] Appl. No.: 355,694

[22] Filed: May 22, 1989

[30] Foreign Application Priority Data

May 23, 1988 [JP] Japan ............................... 63-126899

[51] Int. Cl.$^5$ ..................... H03B 5/20; H03B 19/00; H03K 4/06
[52] U.S. Cl. ........................................ 377/47; 328/20; 307/265
[58] Field of Search ............................. 328/20; 377/47

[56] References Cited

U.S. PATENT DOCUMENTS 4,596,954  6/1986  Haque .................................. 328/20

FOREIGN PATENT DOCUMENTS 0098556  8/1979  Japan ................................... 328/20
0086215  6/1980  Japan ................................... 328/20
0032825  4/1981  Japan ................................... 377/47
0229520  11/1985 Japan ................................... 328/20

*Primary Examiner*—John S. Heyman
*Attorney, Agent, or Firm*—Fliesler, Dubb, Meyer & Lovejoy

[57] ABSTRACT

A frequency doubler operating where the predetermined duty cycle is essentially 50% in response to a series of input pulses with a given frequency and a duty cycle essentially of 50%. The circuit includes a means to generate a ramp signal which the ramp portion forms as a function of the repetition of the input pulses in response to the input pulses, an exclusive-OR logic to evaluate the exclusive-OR of the output from the ramp signal generating means and the input pulses in response to the output from the ramp signal generating means and said input pulses. A means, which is coupled to the ouptut of said exclusive-OR logic, integrates the output of the exclusive-OR logic, adds it to the ouptut from the ramp signal generating means, and feeds it back to the input of the exclusive-OR logic. A means, which is coupled to the integrating and feedback means, and causes the duty cycle of the output from the exclusive-OR logic to become essentially 50% by applying reference voltage.

1 Claim, 1 Drawing Sheet

CIRCUIT FOR MULTIPLYING THE FREQUENCY IN ONE SERIES OF INPUT PULSES

FIELD OF THE INVENTION

This invention generally relates to a frequency multiplying circuit. In particular, it relates to a frequency multiplying circuit to provide a series of pulses in which the frequency is doubled and the duty cycle is essentially 50% in response to a series of input pulses with a given frequency and an duty cycle essentially of 50%.

BACKGROUND OF THE INVENTION

The semiconductor chip of microcomputers, microprocessors, etc. are operated by the function of a series of clock pulses. For example, the microcomputer semiconductor chip called "80286" which can presently be obtained in the marketplace requires a series of clock pulses with frequency of 30 MHz. However, it is difficult to procure quartz oscillators suitable for generating 30 MHz, and moreover, they are expensive. Therefore, it is desirable to be able to obtain clock signal generators in which the frequency of about 30 MHz is generated by multiplying the frequency of a low frequency quartz oscillator which is low in cost and is presently obtainable in the marketplace.

A typical frequency multiplier of clock pulses uses the conventional phase lock loop technology. However, using a phase lock loop requires a voltage control oscillator, a phase comparator, a frequency divider and other circuits. This complicates the shape of the circuit and increases the cost of the multiplier.

A different type of frequency multiplier uses an exclusive-OR logic circuit which has been adapted so that input pulses are received at one input terminal while the integrated output of the input pulses integrated with a predetermined time constant when the duty cycle of said input pulse is essentially 50% is received at the other input terminal. Suppose the duty cycle of the input pulse is 50% and the time constant of the integration is suitably selected, an output in which the frequency is doubled can be obtained with an duty cycle of essentially 50%. However, when the frequency of the input pulse fluctuates, the duty cycle of the output with doubled-frequency varies in accordance to it. This makes it impossible to use the frequency multiplier as the clock pulse source of the semiconductor chip.

SUMMARY OF THE INVENTION

Therefore, the main objective of this invention is to provide a frequency multiplying circuit which multiplies the frequency of the input pulses and provide an output in which the frequency is doubled and the controlled duty cycle is essentially 50% irrespective of the fluctuation in the input frequency.

Another objective of this invention is to provide a frequency multiplying circuit which facilitates the generation of a series of high frequency pulses at low cost and simplifies the circuit by using frequency multiplication.

Yet another objective of this invention is to provide a clock pulse generating circuit to generate a series of clock pulses in which the frequency is doubled and the predetermined duty cycle is essentially 50% in response to a series of input pulses with a given frequency and an duty cycle essentially of 50%.

To explain in simple terms, this invention includes a circuit which generates a series of clock pulses in which the frequency is doubled and the predetermined duty cycle is essentially 50% in response to a series of input pulses with a given frequency and an duty cycle essentially of 50%, a means to generate a ramp signal which the ramp portion forms as a function of the repetition of the input pulses in response to the input pulses, an exclusive-OR logic to evaluate the exclusive-OR of said output from said ramp signal generating means and said input pulses in response to the output from said ramp signal generating means and said input pulses, a means which is coupled to the output of said exclusive-OR logic, integrates the output of the exclusive-OR logic, adds it to the output from the ramp signal generating means, and feeds it back to the input of the exclusive-OR logic, and a means which is coupled to the integrating and feedback means and causes the duty cycle of the output from the exclusive-OR logic to become essentially 50% by applying reference voltage.

The objective of this invention and other objectives, characteristics, aspects, and merits will become clear from the following detailed description of said invention based on the appended figures.

In the figures, (t1) is the ramp signal generating circuit, (t2) is the integrating and feedback circuit, (EXOR) is the exclusive-OR logic circuit, and (S) is the adding circuit.

DETAILED DESCRIPTION OF THE INVENTION

Figure 1:
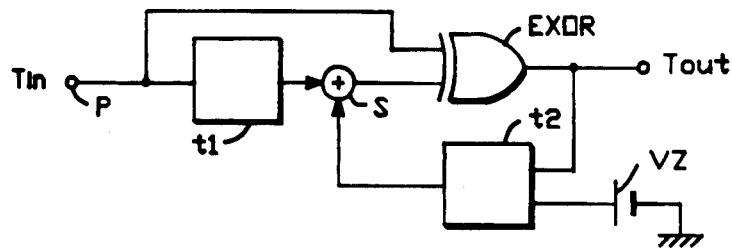
FIG. 1 is a block diagram which shows the principle of said invention's frequency multiplying circuit.

FIG. 1 is a block diagram showing the principle of the frequency multiplying circuit of this invention. The frequency multiplying circuit shown in FIG. 1 includes input terminal (Tin) which receives a series of input pulses with a given frequency and in which the duty cycle is essentially 50%, ramp signal generating circuit (t1) coupled to input terminal (Tin) for generating ramp signal in which the ramp portion is formed as a function of the repetition of the input pulses, add circuit (S) which is coupled to the output of ramp signal generating circuit (t1) and performs add operation for the output from ramp signal generating circuit (t1) and another input to be explained later, exclusive-OR logical circuit (EXOR) which is connected properly so that it receives the input pulses at one input terminal and receives the output from add circuit (S) at the other input terminal, integrating and feedback circuit (t2) for integrating the output from exclusive-OR logic circuit (EXOR) and to feedback the integrated output to the other input terminal of the exclusive-OR logic circuit through adding circuit (s), reference voltage source (V2) for adjusting the direct current level of the output which was integrated so that the duty cycle of the output from exclusive-OR logic circuit (EXOR) is essentially 50%, and output terminal (Tout) which is coupled to the output of exclusive-OR logic circuit (EXOR).

In the operation, the exclusive-OR logic evaluation of the ramp signal generated from ramp signal generating circuit (t1) and the input pulses with a given frequency and in which the duty cycle is essentially 50% generates a series of pulses in which the frequency is doubled and the duty cycle is essentially 50% in a case when the reference voltage provided to the feedback loop has been suitably selected.

Figure 2:
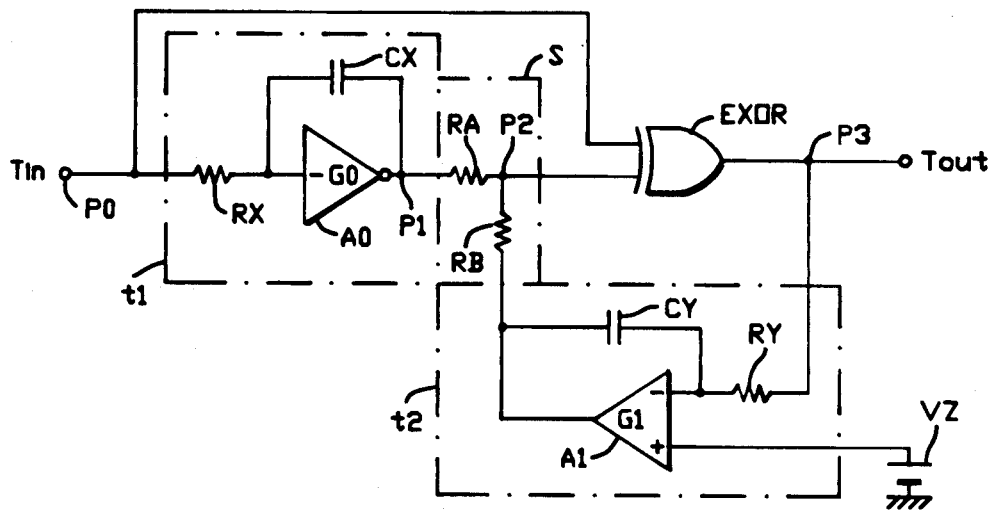
FIG. 2 is a summarized figure of one application example of said invention's frequency multiplying circuit.

FIG. 2 is a summarized figure of one application example of said invention's frequency multiplying circuit which defines the principle of the invention shown in FIG. 1. Ramp signal generating circuit (t1) includes amplifier (A0) of gain (G0), input resistor (RX), and capacitor (CX), and it constitutes the integrating circuit. Adding circuit includes connection between resistor (RA) which is connected from the output of ramp signal generating circuit (t1) and resistor (RB) which is connected from the output of feedback circuit (t2). Integrating and feedback circuit (t2) includes operational amplifier (A1) of gain (G1) which receives the output from exclusive-OR gate (EXOR) at the inverse input terminal, input resistor (RY) which is connected from the output of exclusive-OR gate (EXOR), and capacitor (CY) which is connected between the inverse input terminal and output terminal of operational amplifier (A1). Reference voltage source (Vz) is connected to the non-inverse input terminal of operational amplifier (A1). Input terminal (tin) is connected to receive a series of input pulses with a given frequency and in which the duty cycle is essentially 50%. Moreover, it is connected to the input of ramp signal generating circuit (t1) and to one input terminal of exclusive-OR gate (EXOR). The output from exclusive-OR gate (EXOR) is connected to output terminal (tout).

Figure 3:
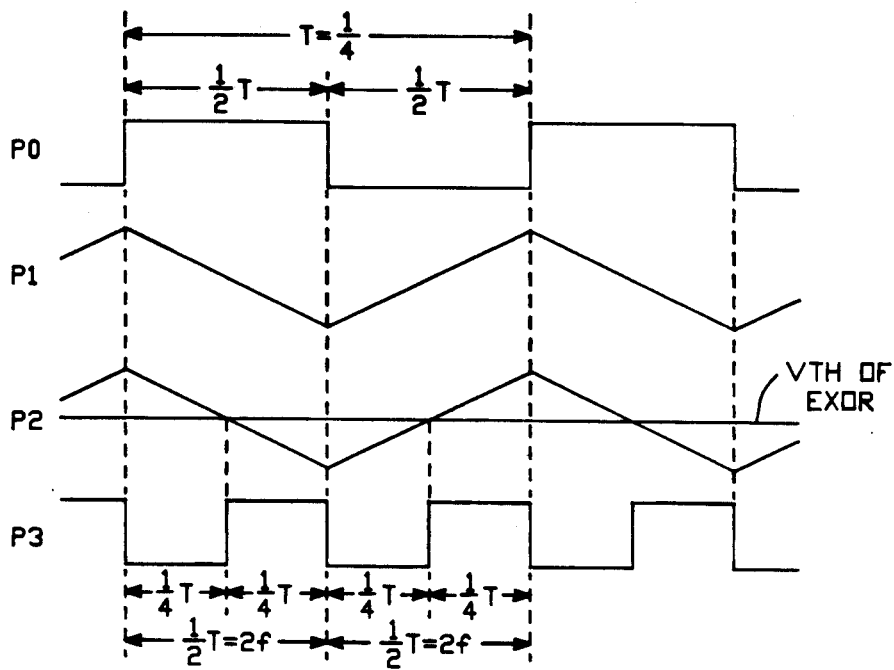
FIG. 3 is a graph showing the waveforms of the signals in the various sections of the circuit shown in FIG. 2.

The operation of the circuit shown in FIG. 2 can be understood clearly by referring to FIG. 3 which shows a graph indicating the waveforms of the signals in various sections of the circuit shown in FIG. 2. A series of input pulses (P0) is directly supplied to exclusive-OR gate (EXOR), then it is supplied to the input of ramp signal generating circuit (t1). Ramp signal generating circuit (t1) integrates the input pulses and converts them into triangular waveform output (P1). When triangular waveform output (P1) is supplied to exclusive-OR gate (EXOR), the output from exclusive-OR gate (EXOR) is integrated by resistor (RY), capacitor (CY), and operational amplifier (A1). The integrated output is fed back to exclusive-OR gate (EXOR) through resistor (RB). The time constant of resistor (RY) and capacitor (CY) is selected to be large enough in comparison to the input pulse time $(1/F_{in}=T)$. Therefore, the output from the integrating and feedback circuit can be considered to be a direct current component. In other words, triangular waveform output (P1) which is fed through resistor (RA) is biased by the direct current component supplied through resistor (RB).

Suppose the high level output voltage from exclusive-OR gate (EXOR) is $V_{OH}$, the period of its high level output is $T_{OH}$, the low level output voltage of its output is $V_{LA}$, and the period of its low level output is $T^{OL}$, the following equation can be obtained in regards to reference voltage (Vz) supplied to the non-inverse input terminal of operational amplifier (A1).

When the voltage at point (P0) is high level, $$(V_{OH} \times t_{OH}) + (V_{OL} \times t_{OL}) = Vz \quad (1)$$

When the voltage at point (P) is low level, $$(V_{OH} \times t_{OH}) + (V_{OL} \times t_{OL}) = Vz \quad (2)$$

$$t_{OL} + t_{OH} = \tfrac{1}{2}T = 2f \quad (3)$$

Suppose that exclusive-OR gate (EXOR) is realized using complementary MOS integrating circuit, the values of output voltages $(V_{OH})$ and $(V_{OL})$ from exclusive-OR gate (EXOR) are well known and are stabilized. Therefore, the duty cycle of the output from exclusive-OR gate (EXOR) is determined as a function of reference voltage (Vz), irrespective of the frequency of the input pulses. Consequently, when reference voltage (Vz) is adjusted so that the duty cycle of the output from exclusive-OR gate (EXOR) essentially becomes 50%, the voltages at the various points (P0), (P1), (P2), and (P3) in the circuit shown in FIG. 2 become as shown in FIG. 3.

Suppose that gain (G1) of operational amplifier (A1) is large enough and that the error at the differential input is stable, the fluctuation in threshold voltage $(V_{TH})$ during an extended period and the fluctuation in time delay of amplifier (A0) and exclusive-OR gate (EXOR) can be ignored due to the integration by capacitor (CY) and resistor (RY). Furthermore, the magnitude of input pulse frequency (Fin) is related to the amplitude of the triangular waveform output obtained at output (P1) of Amplifier (A0); hence, if gain (G1) of amplifier (A1) is large enough, the duty cycle of the output from exclusive-OR gate is not influenced by the magnitude of frequency (Fin).

Consequently, when a series of input pulses is with optional frequency (Fin) and in which the duty cycle is essentially 50%, a series of output pulses with double frequency (2Fin) in which the duty cycle is essentially 50% is obtained. By using a multiple number (N) of the same frequency multiplying circuit, a series of pulses in which the frequencies are 2N x Fin and the duty cycles are essentially 50% is obtained.

This invention was explained in detail and illustrated, but is to be understood that it is not limited to the illustrations and the concrete examples. The spirit and the scope of the invention are limited only by what is expressed in the claim.

I claim:

1. A circuit which multiplies the frequency in a series of input pulses with a given frequency and a duty cycle essentially of 50% comprising:
   a circuit which includes a means to generate a ramp signal in which the ramp portion is formed as a function of the repetition of the input pulse by responding to the input pulses,
   an exclusive-OR logic to evaluate the exclusive-OR logic of said input pulses and the output from said ramp signal generating means.
   a feedback means which couples the output of said exclusive-OR logic to the input of said exclusive-OR logic for integrating the output of said exclusive-OR logic including adding means for adding said integrated feedback signal with said ramp signal from said ramp signal generating means, said added signals coupled to the input of said exclusive-OR logic, and
   a threshold voltage adjusting means coupled to said integrating and feedback means for providing a multiplied frequency having a 50% duty cycle at the output of said exclusive-OR logic by determining the direct current level of the integrating and feedback signal.

* * * * *